United States Patent
Cha et al.

(10) Patent No.: US 9,412,427 B2
(45) Date of Patent: Aug. 9, 2016

(54) PRECHARGE CIRCUIT AND SEMICONDUCTOR APPARATUS INCLUDING THE SAME

(71) Applicant: SK hynix Inc., Icheon-si Gyeonggi-do (KR)

(72) Inventors: Jin Youp Cha, Icheon-si (KR); Seok Cheol Yoon, Icheon-si (KR); Cheol Hoe Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/488,481

(22) Filed: Sep. 17, 2014

(65) Prior Publication Data

US 2015/0364164 A1    Dec. 17, 2015

(30) Foreign Application Priority Data

Jun. 12, 2014    (KR) .................. 10-2014-0071262

(51) Int. Cl.
*G11C 7/12*    (2006.01)
*G11C 7/10*    (2006.01)

(52) U.S. Cl.
CPC ............ *G11C 7/12* (2013.01); *G11C 7/1048* (2013.01)

(58) Field of Classification Search
None
See application file for complete search history.

(56) References Cited

U.S. PATENT DOCUMENTS

2004/0032776 A1*    2/2004    Kim .................... G11C 7/1084
                                                                    365/203

FOREIGN PATENT DOCUMENTS

| JP | 2012027983 | * | 2/2012 |
| KR | 1020100064145 A | | 6/2010 |
| KR | 1020120121309 A | | 11/2012 |

* cited by examiner

*Primary Examiner* — James G Norman
(74) *Attorney, Agent, or Firm* — William Park & Associates Ltd.

(57) ABSTRACT

A semiconductor apparatus includes a memory region configured to store data transmitted through a first data line and a second data line; and a precharge block configured to precharge the second data line to a level of a first voltage and precharge the first data line to a level of a second voltage higher than the level of the first voltage, based on a write signal.

18 Claims, 7 Drawing Sheets

PRECHARGE CIRCUIT AND SEMICONDUCTOR APPARATUS INCLUDING THE SAME

CROSS-REFERENCES TO RELATED APPLICATION

The present application claims priority under 35 U.S.C. §119(a) to Korean application number 10-2014-0071262 filed on Jun. 12, 2014, in the Korean Intellectual Property Office, which is incorporated herein by reference in its entirety.

BACKGROUND

1. Technical Field

Embodiments of the present invention generally relate to a semiconductor apparatus, and more particularly, in one or more embodiments, to a semiconductor apparatus for precharging data lines.

2. Related Art

Integrated circuits, semiconductor-based electronic devices, are used for a variety of devices, including semiconductor memories. There are two types of semiconductor memories: a nonvolatile type and a volatile type.

In a nonvolatile memory device, stored data may be retained even in absence of power supply. Nonvolatile memory devices include flash memory devices, FeRAM (ferroelectric random access memory) devices, PCRAM (phase change random access memory) devices, MRAM (magnetic random access memory) devices, and ReRAM (resistive random access memory) devices.

In contrast, a volatile memory device requires power to maintain the stored data. The volatile memory device, which is generally faster, may be used in a data processing system as a buffer memory device, a cache memory device, or a working memory device. Volatile memory devices include SRAM (static random access memory) devices and DRAM (dynamic random access memory) devices.

Factors such as speed and power consumption may have an influence on the performance of a semiconductor memory apparatus. Therefore, significant efforts are being made to realize a high-speed, low-power-consumption semiconductor memory apparatuses.

SUMMARY

In an embodiment of the present invention, a semiconductor apparatus may include: a memory region configured to store data transmitted through a first data line and a second data line; and a precharge block configured to precharge the second data line to a level of a first voltage and precharge the first data line to a level of a second voltage higher than the level of the first voltage, based on a write signal.

In an embodiment of the present invention, a semiconductor apparatus may include: a data line configured to transmit data; and a precharge block configured to precharge the data line to a level of a core voltage, based on a read signal, wherein the precharge block supplies an external voltage to the data line for a predetermined time before supplying the core voltage, based on the read signal, and a level of the external voltage is higher than the level of the core voltage.

In an embodiment of the present invention, a precharge circuit may include: a control unit configured to generate first to fourth precharge signals, based on a write signal and a read signal; a first voltage supply unit coupled to a first data line; and second to fourth voltage supply units coupled to a second data line, wherein the second to fourth voltage supply units are configured to supply first to third voltages to the second data line in response to the second to fourth precharge signals, respectively, and the first voltage supply unit is configured to supply the second voltage to the first data line in response to the first precharge signal, and wherein a level of the third voltage is higher than each of the first and second voltages and the second voltage is higher than the first voltage.

DETAILED DESCRIPTION

Hereinafter, a precharge circuit and a semiconductor apparatus including the same will be described below with reference to the accompanying drawings through various examples of embodiments of the present invention.

Figure 1:
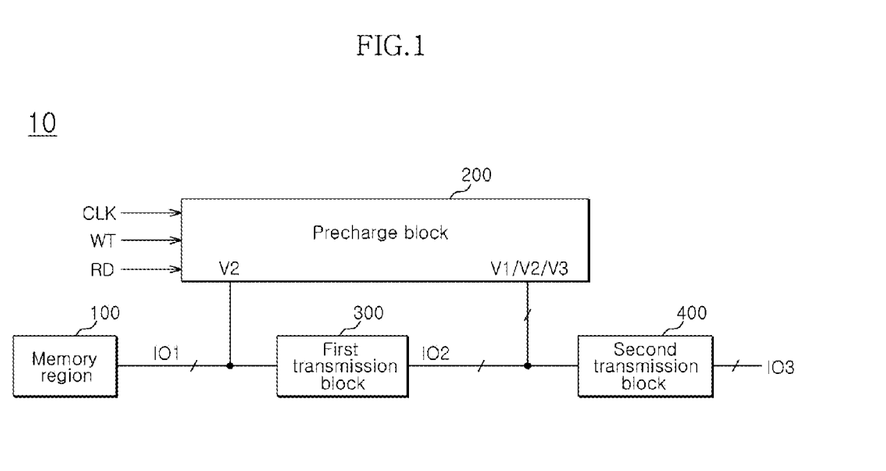
FIG. 1 is a block diagram schematically showing a semiconductor apparatus in accordance with an embodiment of the present invention.

FIG. 1 is a block diagram schematically showing a semiconductor apparatus 10 in accordance with an embodiment of the present invention.

A semiconductor apparatus 10 may include a memory region 100, a precharge block 200, a first transmission block 300, and a second transmission block 400.

The semiconductor apparatus 10 may include a plurality of first data lines IO1 for the communication between the memory region 100 and the first transmission block 300, a plurality of second data lines IO2 for the communication between the first transmission block 300 and the second transmission block 400, and a plurality of third data lines IO3 for the communication between the second transmission block 400 and an external device (not shown). The memory region 100 may be electrically coupled to another component through at least one first data line IO1. The memory region 100 may store data which is inputted from the external device through at least one third data line IO3, at least one second data line IO2 and at least one first data line IO1. The memory region 100 may include a memory cell array (not shown) which includes a plurality of memory cells.

The precharge block 200 may precharge the plurality of second data lines IO2 to the level of a first voltage V1 and precharge the plurality of first data lines IO1 to the level of a second voltage V2 based on a write signal WT. The precharge block 200 may precharge the plurality of second data lines IO2 to the level of the second voltage V2 based on a read signal RD. According to an embodiment of the present invention, the precharge block 200 may supply a third voltage V3 to the plurality of second data lines IO2, for a predetermined time, e.g., for an overdriving time, before supplying the second voltage V2 based on the read signal RD.

The precharge block 200 may precharge the plurality of first data lines IO1 and the plurality of second data lines IO2 in response to a clock signal CLK, the write signal WT and the read signal RD. The write signal WT may be a signal which is generated in the semiconductor apparatus 10 in response to a write command provided from an external device. The read signal RD may be a signal which is generated in the semiconductor apparatus 10 in response to a read command provided from an external device. In the case of the enable period of the write signal WT or the read signal RD, data may be written in the memory region 100 or be read from the memory region 100.

The precharge block 200 may selectively supply voltages to the plurality of first data lines IO1 and the plurality of second data lines IO2, and whether to supply the voltages may be determined based on whether the write signal WT has consecutive enable periods. In other words, the precharge block 200 may monitor whether a write operation is consecutively performed for the memory region 100, by referring to the write signal WT, and determine whether to perform a precharge operation for the plurality of first data lines IO1 and the plurality of second data lines IO2.

The precharge block 200 may interrupt the supply of voltages, which may be made to the plurality of first data lines IO1 and the plurality of second data lines IO2, in the case where the write signal WT has a first enable period. The precharge block 200 may continue to interrupt the supply of voltages, which may be made to the plurality of first data lines IO1 and the plurality of second data lines IO2, in the case where the write signal WT has a second enable period within a predetermined time after the first enable period of the write signal WT. The precharge block 200 may continue to interrupt the supply of voltages, which may be made to the plurality of first data lines IO1 and the plurality of second data lines IO2, according to whether there is a subsequent enable period even after the second enable period of the write signal WT. For example, the predetermined time may be a time between the moment when a write signal WT is enabled and the moment when the next write signal WT is enabled.

The precharge block 200 may supply the second voltage V2 to the plurality of first data lines IO1 and supply the first voltage V1 to the plurality of second data lines IO2, in the case where the write signal WT does not have the second enable period within the predetermined time after the first enable period of the write signal WT. The level of the second voltage V2 may be higher than the level of the first voltage V1. The first voltage V1 may be, for example, a voltage being supplied to a bit line (not shown) electrically coupled to the memory cells of the memory region 100 when precharging the bit line. The second voltage V2 may be, for example, a core voltage being applied to the core region of the semiconductor apparatus 10.

The precharge block 200 may supply the second voltage V2 to the plurality of second data lines IO2 in the case where the read signal RD has an enable period. According to an embodiment of the present invention, the precharge block 200 may supply the third voltage V3 to the plurality of second data lines IO2 for the overdriving time, before supplying the second voltage V2 in response to the read signal RD. The level of the third voltage V3 may be higher than the level of the second voltage V2. The third voltage V3 may be, for example, an external voltage applied to the semiconductor apparatus 10 from an external device.

The first transmission block 300 may electrically connect the plurality of first data lines IO1 to the plurality of second data lines IO2 for data transmission. The second transmission block 400 may electrically connect the plurality of second data lines IO2 to the plurality of third data lines IO3 for data transmission. Each of the first and second transmission blocks 300 and 400 may transmit data amplified through differential amplification or may transmit data as it is. During a write operation, the data inputted from the external device and transmitted through the plurality of third data lines IO3 may be transmitted to the plurality of second data lines IO2 and the plurality of first data lines IO1 by the second transmission block 400 and the first transmission block 300, and may be stored in the memory region 100. During a read operation, the data may be transmitted in the opposite direction.

The plurality of first data lines IO1 may be, for example, segment data lines. The plurality of second data lines IO2 may be, for example, local data lines. The plurality of third data lines IO3 may be, for example, global data lines.

Figure 2:
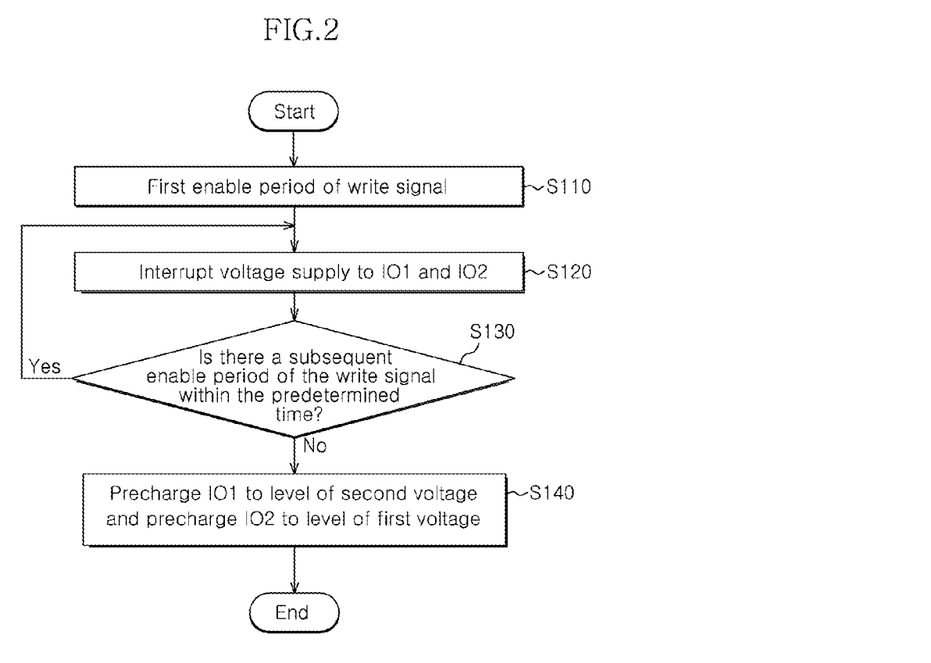
FIGS. 2 and 3 are flow charts briefly explaining the operations of the precharge block shown in FIG. 1.
Figure 3:
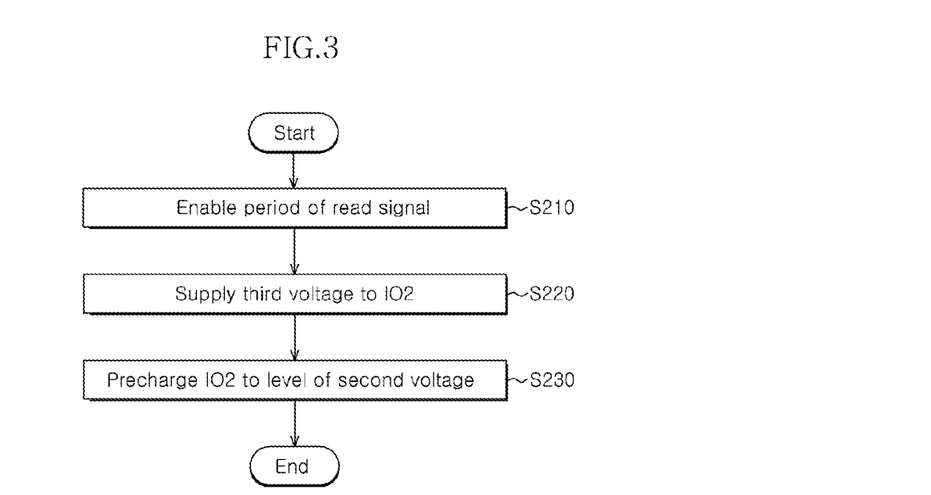

FIGS. 2 and 3 are flow charts briefly explaining the operations of the precharge block 200 shown in FIG. 1.

FIG. 2 shows the operations of the precharge block 200 when the write signal WT has an enable period.

In step S110, the write signal WT may have a first enable period.

In step S120, the precharge block 200 may interrupt the supply of voltages, which may be made to a first data line IO1 and a second data line IO2. Thereafter, data may be transmitted through the second data line IO2 and the first data line IO1, and the transmitted data may be stored in the memory region 100.

In step S130, whether or not the process proceeds to the next step may be determined according to whether the write signal WT has a subsequent enable period within the predetermined time from the first enable period of the write signal WT.

In the case where the write signal WT has a subsequent enable period within the predetermined time from the first enable period of the write signal WT, the process may come back to the step S120, and thereby the precharge block 200 may continue to interrupt the supply of voltages to the first data line IO1 and the second data line IO2. At the step S130 again, whether or not the process proceeds to the next step may be determined according to whether the write signal WT has the subsequent enable period within the predetermined time from the first enable period of the write signal WT.

In the case where the write signal WT does not have a subsequent enable period within the predetermined time, the process may proceed to step S140.

In the step S140, the precharge block 200 may precharge the first data line IO1 to the level of the second voltage V2, and may precharge the second data line IO2 to the level of the first voltage V1. The level of the second voltage V2 may be higher than the level of the first voltage V1.

The process of FIG. 2 may be repeated in the same manner in the case where it is determined in the step S130 that the write signal WT does not have a subsequent enable period within the predetermined time from the first enable period of the write signal WT and does have after the predetermined time. In this situation, the process may proceed to the step S140. Then, the subsequent enable period of the write signal WT may be construed as another first enable period in the step S110, and the process may start again from the step S110.

FIG. 3 shows the operations of the precharge block 200 when the read signal RD has an enable period. For example, where the process shown in FIG. 3 is performed following the process of FIG. 2, before step S210 starts, the first data line IO1 may be in a state in which it has been precharged to the level of the second voltage V2, and the second data line IO2 may be in a state in which it has been precharged to the level of the first voltage V1.

In the step S210, the read signal RD may have an enable period.

In step S220, the precharge block 200 may supply the third voltage V3 to the second data line IO2 for the overdriving time. The level of the third voltage V3 may be higher than the level of the second voltage V2.

In step S230, the precharge block 200 may precharge the second data line IO2 to the level of the second voltage V2 after the overdriving time. Thereafter, the data read from the memory region 100 may be transmitted by charge sharing through the first data line IO1 and the second data line IO2 which are precharged to the level of the second voltage V2, and may be outputted to the external device.

In an embodiment of the present invention, the precharge block 200 does not consecutively perform the precharge operation for the first data line IO1 and the second data line IO2 while the write operation is consecutively performed, that is, while the write signal WT has consecutive enable periods each enable period begins within the predetermined time after previous enable period of the write signal WT. By not consecutively performing the precharge operation, the power consumption of the semiconductor apparatus 10 may be reduced. If the consecutive performances of the write operation end, the precharge block 200 precharges the second data line IO2 with a voltage lower than the voltage of the first data line IO1 until a read operation starts, peak current and unexpected voltage drop may be minimized. The precharge block 200 may precharge the second data line IO2, with a higher precharge voltage than the precharge voltage above, only when starting the read operation, and data may be transmitted through the first data line IO1 and the second data line IO2 by charge sharing. According to an embodiment of the present invention, the precharge block 200 may overdrive the second data line IO2 when starting the read operation, and may quickly raise the voltage level of the second data line IO2.

Figure 4:
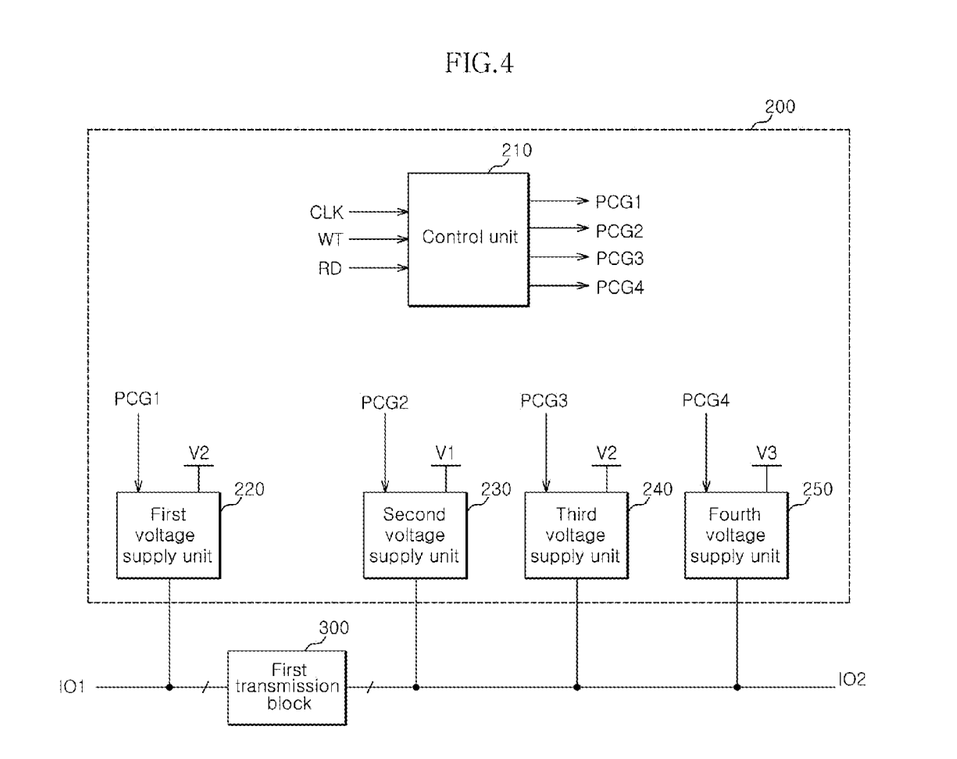
FIG. 4 is a block diagram schematically showing the precharge block shown in FIG. 1.

FIG. 4 is a block diagram schematically showing the precharge block 200 shown in FIG. 1.

The precharge block 200 may include a control unit 210, and first to fourth voltage supply units 220 to 250.

The control unit 210 may generate first to fourth precharge signals PCG1 to PCG4, based on the clock signal CLK, the write signal WT and the read signal RD.

The control unit 210 may generate the first precharge signal PCG1 according to whether the write signal WT has consecutive enable periods. The control unit 210 may disable the first precharge signal PCG1, based on a first enable period of the write signal WT. For example, a disable period of the first precharge signal PCG1 may continue if the write signal WT has consecutive enable periods. The control unit 210 may continue to disable the first precharge signal PCG1 in the case where the write signal WT has a second enable period within a predetermined time after the first enable period. In contrast, for example, the first precharge signal PCG1 may become enabled if consecutive enable periods of the write signal WT ends. The control unit 210 may enable the first precharge signal PCG1 in the case where the write signal WT does not have a second enable period within a predetermined time after the first enable period. The control unit 210 may disable the first precharge signal PCG1 for a data transmission time, based on the enable period of the read signal RD.

The control unit 210 may generate the second precharge signal PCG2 according to whether the write signal WT has consecutive enable periods. The control unit 210 may disable the second precharge signal PCG2, based on the first enable period of the write signal WT. For example, a disable period of the second precharge signal PCG2 may continue if the write signal WT has consecutive enable periods. The control unit 210 may enable the second precharge signal PCG2 in the case where the write signal WT does not have the second enable period within the predetermined time after the first enable period. The control unit 210 may disable the second precharge signal PCG2, based on the enable period of the read signal RD.

The control unit 210 may disable the third precharge signal PCG3, based on the enable period of the write signal WT. The control unit 210 may enable the third precharge signal PCG3 after the overdriving time has passed, based on the enable period of the read signal RD. The control unit 210 may disable the third precharge signal PCG3 for the data transmission time, based on the enable period of the read signal RD.

The control unit 210 may enable the fourth precharge signal PCG4 for the overdriving time before enabling the third precharge signal PCG3, based on the enable period of the read signal RD.

The first voltage supply unit 220 may supply the second voltage V2 to the first data line IO1 in response to the first precharge signal PCG1.

The second voltage supply unit 230 may supply the first voltage V1 to the second data line IO2 in response to the second precharge signal PCG2.

The third voltage supply unit 240 may supply the second voltage V2 to the second data line IO2 in response to the third precharge signal PCG3.

The fourth voltage supply unit 250 may supply the third voltage V3 to the second data line IO2 in response to the fourth precharge signal PCG4.

Figure 5:
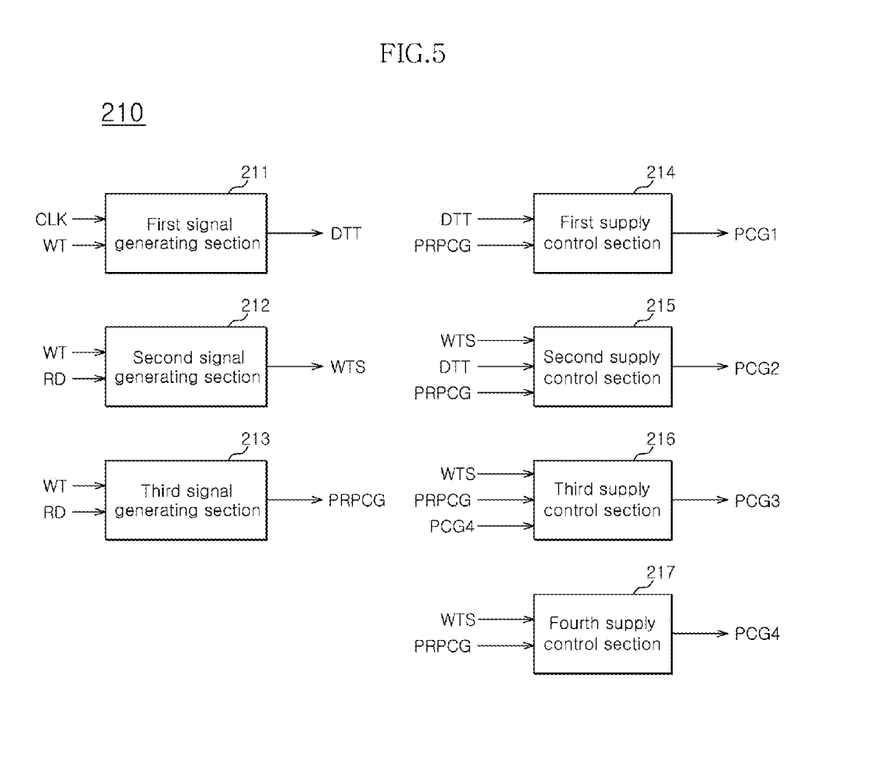
FIG. 5 is a block diagram schematically showing the control unit shown in FIG. 4.

FIG. 5 is a block diagram schematically showing the control unit 210 shown in FIG. 4.

The control unit 210 may include first to third signal generating sections 211 to 213, and first to fourth supply control sections 214 to 217.

The first signal generating section 211 may generate a detection signal DTT in response to the clock signal CLK and the write signal WT. The detection signal DTT may include information on consecutive generation of the enable period of the write signal WT. In other words, the detection signal DTT may include information on whether to consecutively perform the write operation. The first signal generating section 211 may enable the detection signal DTT, based on a first enable period of the write signal WT. The first signal generating section 211 may continue to enable the detection signal DTT in the case where the write signal WT has a second enable period within the predetermined time after the first enable period. The first signal generating section 211 may disable the detection signal DTT in the case where the write signal WT does not have the second enable period within the predetermined time after the first enable period.

The second signal generating section 212 may generate a write strobe signal WTS in response to the write signal WT and the read signal RD. The write strobe signal WTS may include information on whether the write operation or the read operation is started. The second signal generating section 212 may enable the write strobe signal WTS, based on the enable period of the write signal WT. The second signal generating section 212 may disable the write strobe signal WTS, based on the enable period of the read signal RD.

The third signal generating section 213 may generate a precharge preparation signal PRPCG in response to the write signal WT or the read signal RD. The precharge preparation signal PRPCG may include information on timings at which data is transmitted through the first data line IO1 and the second data line IO2. The third signal generating section 213 may disable the precharge preparation signal PRPCG for the data transmission time, based on the enable period of the write signal WT or the read signal RD.

The first supply control section 214 may generate the first precharge signal PCG1 in response to the detection signal DTT and the precharge preparation signal PRPCG. The first supply control section 214 may control the supply of the second voltage V2 to the first data line IO1, based on consecutive generation of the enable period of the write signal WT and the data transmission timing. The first supply control section 214 may disable the first precharge signal PCG1 in response to an enabled detection signal DTT. The first supply control section 214 may enable the first precharge signal PCG1 in response to a disabled detection signal DTT. The first supply control section 214 may disable the first precharge signal PCG1 for the data transmission time in response to a disabled precharge preparation signal PRPCG.

The second supply control section 215 may generate the second precharge signal PCG2 in response to the write strobe signal WTS, the detection signal DTT and the precharge preparation signal PRPCG. The second supply control section 215 may control the supply of the first voltage V1 to the second data line IO2, based on the start of the write operation or the read operation, consecutive generation of the enable period of the write signal WT, and the data transmission timing. The second supply control section 215 may enable the second precharge signal PCG2 in response to a disabled detection signal DTT. The second supply control section 215 may disable the second precharge signal PCG2 in response to a disabled write strobe signal WTS.

The third supply control section 216 may generate the third precharge signal PCG3 in response to the write strobe signal WTS, the precharge preparation signal PRPCG and the fourth precharge signal PCG4. The third supply control section 216 may control the supply of the second voltage V2 to the second data line IO2, based on the start of the write operation or the read operation, the data transmission timing and the end of the overdriving of the second data line IO2. For example, the third supply control section 216 may disable the third precharge signal PCG3 in response to an enabled write strobe signal WTS. The third supply control section 216 may enable the third precharge signal PCG3 in response to a disabled fourth precharge signal PCG4. The third supply control section 216 may disable the third precharge signal PCG3 for the data transmission time in response to a disabled precharge preparation signal PRPCG.

The fourth supply control section 217 may generate the fourth precharge signal PCG4 in response to the write strobe signal WTS and the precharge preparation signal PRPCG. The fourth supply control section 217 may control the supply of the third voltage V3 to the second data line IO2, based on the start of the write operation or the read operation and the data transmission timing. For example, the fourth supply control section 217 may enable the fourth precharge signal PCG4 for the overdriving time in response to a disabled write strobe signal WTS.

Figure 6:
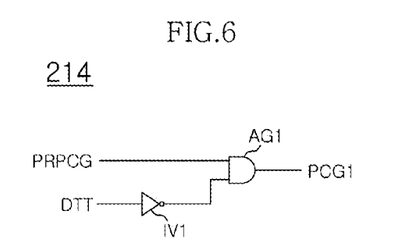
FIG. 6 is a circuit diagram showing in detail the first supply control section shown in FIG. 5.

FIG. 6 is a circuit diagram showing in detail the first supply control section 214 shown in FIG. 5.

The first supply control section 214 may generate the first precharge signal PCG1 in response to the precharge preparation signal PRPCG and the detection signal DTT. The first supply control section 214 may include a first inverter IV1 and a first AND gate AG1. The first inverter IV1 may invert the detection signal DTT. The first AND gate AG1 may output the first precharge signal PCG1 through an AND operation, in response to the output of the first inverter IV1 and the precharge preparation signal PRPCG.

Figure 7:
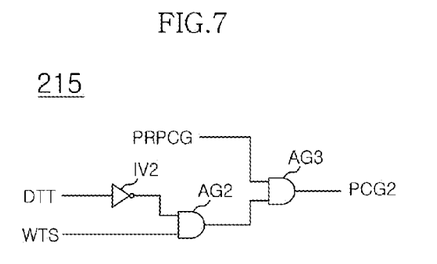
FIG. 7 is a circuit diagram showing in detail the second supply control section shown in FIG. 5.

FIG. 7 is a circuit diagram showing in detail the second supply control section 215 shown in FIG. 5.

The second supply control section 215 may generate the second precharge signal PCG2 in response to the precharge preparation signal PRPCG, the detection signal DTT and the write strobe signal WTS. The second supply control section 215 may include a second inverter IV2 and second and third AND gates AG2 and AG3. The second inverter IV2 may invert the detection signal DTT. The second AND gate AG2 may perform an AND operation in response to the output of the second inverter IV2 and the write strobe signal WTS. The third AND gate AG3 may output the second precharge signal PCG2 through an AND operation, in response to the precharge preparation signal PRPCG and the output of the second AND gate AG2.

Figure 8:
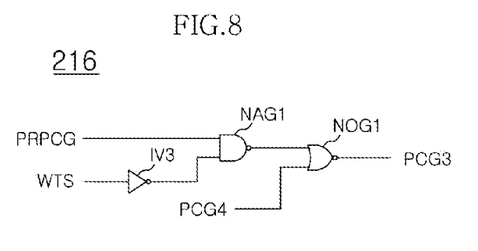
FIG. 8 is a circuit diagram showing in detail the third supply control section shown in FIG. 5.

FIG. 8 is a circuit diagram showing in detail the third supply control section 216 shown in FIG. 5.

The third supply control section 216 may generate the third precharge signal PCG3 in response to the precharge preparation signal PRPCG, the write strobe signal WTS and the fourth precharge signal PCG4. The third supply control section 216 may include a third inverter IV3, a first NAND gate NAG1, and a first NOR gate NOG1. The third inverter IV3 may invert the write strobe signal WTS. The first NAND gate NAG1 may perform a NAND operation in response to the precharge preparation signal PRPCG and the output of the third inverter IV3. The first NOR NOG1 may output the third precharge signal PCG3 through a NOR operation, in response to the output of the first NAND gate NAG1 and the fourth precharge signal PCG4.

Figure 9:
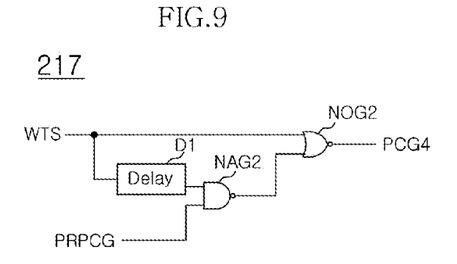
FIG. 9 is a circuit diagram showing in detail the fourth supply control section shown in FIG. 5.

FIG. 9 is a circuit diagram showing in detail the fourth supply control section 217 shown in FIG. 5.

The fourth supply control section 217 may generate the fourth precharge signal PCG4 in response to the write strobe signal WTS and the precharge preparation signal PRPCG. The fourth supply control section 217 may include a delay D1, a second NAND gate NAG2, and a second NOR gate NOG2. The period that the fourth supply control section 217 continue to enable the fourth precharge signal PCG4 may correspond to the delay time the delay D1 delays the disabled write strobe signal WTS. The delay D1 may delay the write strobe signal WTS. The second NAND gate NAG2 may perform a NAND operation in response to the output of the delay D1 and the precharge preparation signal PRPCG. The second NOR gate NOG2 may output the fourth precharge signal PCG4 through a NOR operation, in response to the write strobe signal WTS and the output of the second NAND gate NAG2.

Figure 10:
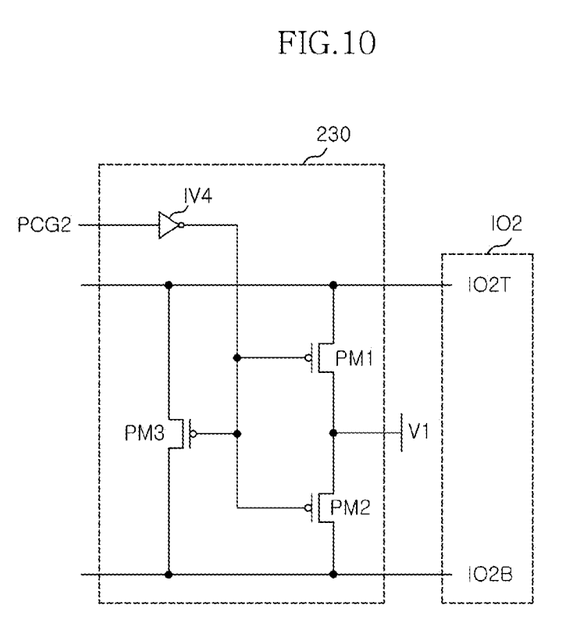
FIG. 10 is a circuit diagram showing in detail the second voltage supply unit shown in FIG. 4.

FIG. 10 is a circuit diagram showing in detail the second voltage supply unit 230 shown in FIG. 4.

In FIG. 10, the second data line IO2 may include a second data line IO2T and a second data line bar IO2B. In an embodiment of the present invention, the semiconductor apparatus 10 may transmit signals in a differential scheme.

The second voltage supply unit 230 may include a fourth inverter IV4, and first to third PMOS transistors PM1 to PM3. The fourth inverter IV4 may invert the second precharge signal PCG2. The first PMOS transistor PM1 may form a current path between a power supply terminal, which provides the first voltage V1, and the second data line IO2T in response to the output signal of the fourth inverter IV4. The second PMOS transistor PM2 may form a current path between the power supply terminal, which provides the first voltage V1, and the second data line bar IO2B in response to the output signal of the fourth inverter IV4. The third PMOS transistor PM3 may electrically couple the second data line IO2T and the second data line bar IO2B in response to the output of the fourth inverter IV4.

The first, third and fourth voltage supply units 220, 240 and 250 of FIG. 4 may be configured and operate in a similar manner to the second voltage supply unit 230 of FIG. 10. The first data line IO1 of FIG. 4 may include a first data line and a first data line bar. Accordingly, detailed descriptions will be omitted herein.

Figure 11:
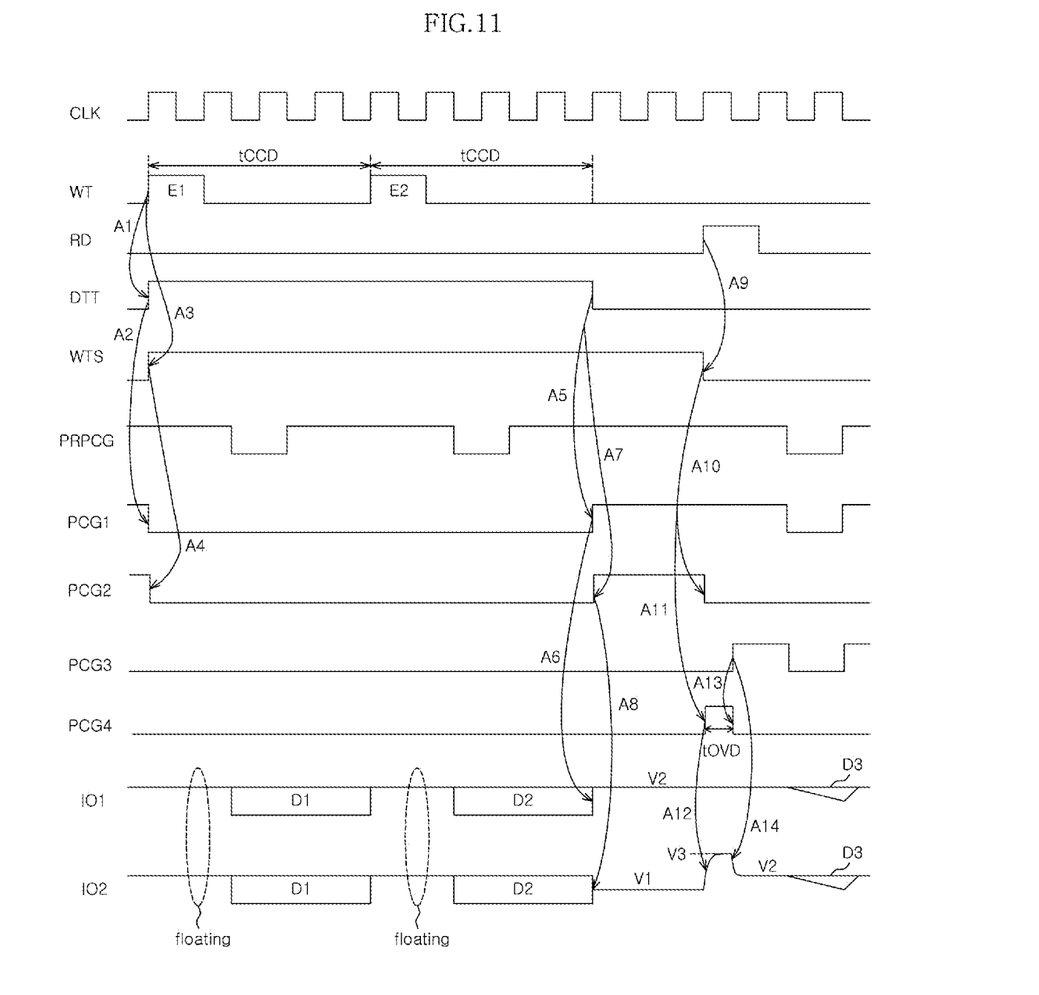
FIG. 11 is a timing diagram explaining the operation method of the semiconductor apparatus shown in FIG. 1.

FIG. 11 is a timing diagram explaining the operation method of the semiconductor apparatus 10 shown in FIG. 1.

An example of the operation method of the semiconductor apparatus 10 will be described in detail with reference to FIGS. 1 to 11.

The first signal generating section 211 may enable the detection signal DTT, based on a first enable period E1 of the write signal WT (A1). The first supply control section 214 may disable the first precharge signal PCG1 in response to the enabled detection signal DTT (A2). The first voltage supply unit 220 may interrupt supply of the second voltage V2 to the first data line IO1 in response to the disabled first precharge signal PCG1. As a result, the first data line IO1 may be in a floating state (high impedance state).

The second signal generating section 212 may enable the write strobe signal WTS, based on the first enable period E1 of the write signal WT (A3). The second supply control section 215 may disable the second precharge signal PCG2 in response to the enabled write strobe signal WTS (A4). The second voltage supply unit 230 may interrupt supply of the first voltage V1 to the second data line IO2 in response to the disabled second precharge signal PCG2. As a result, the second data line IO2 may be in a floating state (high impedance state).

Data D1 corresponding to the first enable period E1 may be transmitted from the third data line IO3 to the second data line IO2 and the first data line IO1 by the second and first transmission blocks 400 and 300, and may be stored in the memory region 100.

The first signal generating section 211 may continue to enable the detection signal DTT, if the write signal WT has a second enable period E2 within a predetermined time tCCD (for example, 4 cycles of the clock signal CLK) after the first enable period E1 of the write signal WT. The first supply control section 214 and the second supply control section 215 may continue to disable the first precharge signal PCG1 and the second precharge signal PCG2, and the first voltage supply unit 220 and the second voltage supply unit 230 may continue to interrupt supply of voltages to the first data line IO1 and the second data line IO2.

Data D2 corresponding to the second enable period E2 may be transmitted from the third data line IO3 to the second data line IO2 and the first data line IO1 by the second and first transmission blocks 400 and 300, and may be stored in the memory region 100.

The precharge block 200 may continue to interrupt supply of voltages to the first data line IO1 and the second data line IO2, based on the consecutive first and second enable periods E1 and E2 of the write signal WT. Since the precharge block 200 does not perform continuously the precharge operation for the first data line IO1 and the second data line IO2 while the write operation is continuously performed, the power consumption of the semiconductor apparatus 10 may be reduced.

Since the write signal WT does not have a subsequent enable period within the predetermined time tCCD after the second enable period E2 of the write signal WT, the first signal generating section 211 may disable the detection signal DTT.

The first supply control section 214 may enable the first precharge signal PCG1 in response to the disabled detection signal DTT (A5). The first voltage supply unit 220 may supply the second voltage V2 to the first data line IO1 in response to the enabled first precharge signal PCG1 (A6). The first data line IO1 may be precharged to the level of the second voltage V2.

The second supply control section 215 may enable the second precharge signal PCG2 in response to the disabled detection signal DTT (A7). The second voltage supply unit 230 may supply the first voltage V1 to the second data line IO2 in response to the enabled second precharge signal PCG2 (A8). The second data line IO2 may be precharged to the level of the first voltage V1.

When the continuous performance of the write operation ends, the precharge block 200 precharges the second data line IO2 with a voltage having a level lower than the first data line IO1, before the read operation is started, peak current and unexpected voltage drop may be minimized.

The second signal generating section 212 may disable the write strobe signal WTS, based on the enable period of the read signal RD (A9). The second supply control section 215 may disable the second precharge signal PCG2 in response to the disabled write strobe signal WTS (A10). The fourth supply control section 217 may enable the fourth precharge signal PCG4 for an overdriving time tOVD in response to the disabled write strobe signal WTS (A11). The fourth voltage supply unit 250 may supply the third voltage V3 to the second data line IO2 for the overdriving time tOVD in response to the enabled fourth precharge signal PCG4 (A12). The second data line IO2 may be overdriven to the level of the third voltage V3.

The third supply control section 216 may enable the third precharge signal PCG3 in response to the disabled fourth precharge signal PCG4 (A13). The third voltage supply unit 240 may supply the second voltage V2 to the second data line IO2 in response to the enabled third precharge signal PCG3 (A14). The second data line IO2 may be precharged to the level of the second voltage V2.

In an embodiment of the present invention, only when the read operation is started, the precharge block 200 may precharge the second data line IO2 with a higher voltage. As the precharge block 200 overdrives the second data line IO2, the voltage level of the second data line IO2 may be quickly raised.

The third signal generating section 213 may disable the precharge preparation signal PRPCG for a data transmission time, based on the enable period of the read signal RD. The first supply control section 214 and the third supply control section 216 may disable the first precharge signal PCG1 and the third precharge signal PCG3, based on the disable period of the precharge preparation signal PRPCG. Data D3 read from the memory region 100 and loaded on the first data line IO1 may be transmitted to the second data line IO2 and the third data line IO3 by the first and second transmission blocks 300 and 400, and may be outputted to an external device.

In the semiconductor apparatus according to an embodiment of the present invention, peak current and unexpected voltage drop may be minimized and power consumption may decrease.

In an embodiment of the present invention, an electronic system may include a precharge circuit that may reduce power consumption by omitting some of precharge operations in a particular situation. The precharge circuit may include a control unit, which may generate first to fourth precharge signals in response to a write signal and a read signal, a first voltage supply unit, which is coupled to a first data line, and second to fourth voltage supply units, which are coupled to a second data line. The second to fourth voltage supply units may supply first to third voltages to the second data line in response to the second to fourth precharge signals, respectively. The first voltage supply unit may supply the second voltage to the first data line in response to the first precharge signal. The control unit may generate the first and second precharge signals, and whether to generate the first and second precharge signals may be determined based on whether the write signal has consecutive enable periods. The control unit may disable the first and second precharge signals, based on a first enable period of the write signal, and enables the first and second precharge signals in the case where the write signal does not have a second enable period within a predetermined time after the first enable period of the write signal.

While various embodiments have been described above, it will be understood to those skilled in the art that the embodiments described are by way of example only. Accordingly, the precharge circuit and the semiconductor apparatus including the same described herein should not be limited based on the described embodiments.

What is claimed is:

1. A semiconductor apparatus comprising:
a memory region configured to store data transmitted through a first data line and a second data line; and
a precharge block configured to precharge the second data line to a level of a first voltage and precharge the first data line to a level of a second voltage higher than the level of the first voltage, based on a write signal,
wherein the precharge block interrupts precharging of the first and second data lines based on a first enable period of the write signal, and continues to interrupt the precharging depending on whether the write signal has a second enable period within a predetermined time after the first enable period.

2. The semiconductor apparatus according to claim 1, wherein the precharge block is configured to selectively supply voltages to the first and second data lines, and wherein whether to supply the voltages is determined based on whether the write signal has consecutive enable periods.

3. The semiconductor apparatus according to claim 1, wherein the precharge block supplies the voltages to the first and second data lines in the case where the write signal does not have the second enable period within the predetermined time after the first enable period of the write signal.

4. The semiconductor apparatus according to claim 1, wherein the precharge block is configured to continue to interrupt supply of voltages to the first and second data lines in the case where the write signal has the second enable period within the predetermined time.

5. The semiconductor apparatus according to claim 1, wherein the precharge block precharges the second data line to the level of the second voltage based on a read signal.

6. The semiconductor apparatus according to claim 5,
wherein the precharge block supplies a third voltage to the second data line for a predetermined time before supplying the second voltage based on the read signal, and wherein a level of the third voltage is higher than the level of the second voltage.

7. The semiconductor apparatus according to claim 1, further comprising:
a transmission block electrically coupled between the first data line and the second data line, and configured to transmit data, which are read from the memory region and loaded on the first data line, to the second data line from the first data line.

8. A semiconductor apparatus comprising:
a data line configured to transmit data; and
a precharge block configured to precharge the data line to a level of a core voltage, based on a read signal,
wherein the precharge block supplies an external voltage to the data line for a predetermined time before supplying the core voltage based on the read signal, and a level of the external voltage is higher than the level of the core voltage,
wherein the precharqe block precharges the data line to a level of a precharqe voltage lower than the level of the core voltage based on a write signal.

9. The semiconductor apparatus according to claim 8, wherein the precharge block is configured to selectively supply the precharge voltage to the data line, wherein whether to supply the precharge voltage is determined based on whether the write signal has consecutive enable periods.

10. The semiconductor apparatus according to claim 8, wherein the precharge block interrupts supply of the precharge voltage to the data line, based on a first enable period of the write signal, and supplies the precharge voltage to the data line in the case where the write signal does not have a second enable period within a predetermined time after the first enable period of the write signal.

11. The semiconductor apparatus according to claim 8, further comprising:
an input/output data line,
wherein the precharge block precharges the input/output data line to the level of the core voltage based on the write signal.

12. The semiconductor apparatus according to claim 11, wherein the precharge block is configured to selectively supply the core voltage to the input/output data line, and wherein whether to supply the core voltage is determined based on whether the write signal has consecutive enable periods.

13. The semiconductor apparatus according to claim 11, wherein the precharge block interrupts supply of the core voltage to the input/output data line, based on a first enable period of the write signal, and supplies the core voltage to the input/output data line in the case where the write signal does not have a second enable period within a predetermined time after the first enable period of the write signal.

14. A precharge circuit, comprising:
a control unit configured to generate first to fourth precharge signals based on a write signal and a read signal;
a first voltage supply unit coupled to a first data line; and
second to fourth voltage supply units coupled to a second data line,
wherein the second to fourth voltage supply units are configured to supply first to third voltages to the second data line in response to the second to fourth precharge signals, respectively, and the first voltage supply unit is configured to supply the second voltage to the first data line in response to the first precharge signal, and
wherein a level of the third voltage is higher than each of the first and second voltages and the second voltage is higher than the first voltage.

15. The precharge circuit according to claim 14, wherein the control unit generates the first and second precharge signals, and wherein whether to generate the first and second precharge signals is determined based on whether the write signal has consecutive enable periods.

16. The precharge circuit according to claim 14, wherein the control unit disables the first and second precharge signals, based on a first enable period of the write signal, and enables the first and second precharge signals in the case where the write signal does not have a second enable period within a predetermined time after the first enable period of the write signal.

17. The precharge circuit according to claim 14, wherein the control unit enables the third precharge signal, based on an enable period of the read signal.

18. The precharge circuit according to claim 17, wherein the control unit enables the fourth precharge signal for a predetermined time before enabling the third precharge signal, based on an enable period of the read signal.

* * * * *